(12) United States Patent
Kraxner et al.

(10) Patent No.: US 10,164,165 B2
(45) Date of Patent: Dec. 25, 2018

(54) PIEZOELECTRIC TRANSFORMER AND COUNTER ELECTRODE

(71) Applicant: EPCOS AG, Munich (DE)

(72) Inventors: Peter Kraxner, Fernitz (AT); Markus Puff, Graz (AT)

(73) Assignee: EPCOS AG, Munich (DE)

( * ) Notice: Subject to any disclaimer, the term of this patent is extended or adjusted under 35 U.S.C. 154(b) by 300 days.

(21) Appl. No.: 15/035,198

(22) PCT Filed: Aug. 27, 2014

(86) PCT No.: PCT/EP2014/068172
§ 371 (c)(1),
(2) Date: May 6, 2016

(87) PCT Pub. No.: WO2015/067388
PCT Pub. Date: May 14, 2015

(65) Prior Publication Data
US 2016/0284970 A1    Sep. 29, 2016

(30) Foreign Application Priority Data

Nov. 8, 2013    (DE) .................. 10 2013 112 316

(51) Int. Cl.
*H01L 41/04*    (2006.01)
*H01L 41/107*    (2006.01)
*H01L 41/047*    (2006.01)
*H05H 1/24*    (2006.01)

(52) U.S. Cl.
CPC .......... *H01L 41/107* (2013.01); *H01L 41/047* (2013.01); *H05H 2001/2481* (2013.01)

(58) Field of Classification Search
CPC ............................ H01L 41/047; H01L 41/107
USPC .......................................................... 310/318
See application file for complete search history.

(56) References Cited

U.S. PATENT DOCUMENTS

| 2,716,708 | A | 8/1955 | Bradfield |
| 6,147,448 | A | 11/2000 | Huang |
| 2012/0263628 | A1 | 10/2012 | Tandou et al. |

FOREIGN PATENT DOCUMENTS

| CN | 1411079 A | 4/2003 |
| CN | 1988198 A | 6/2007 |
| CN | 101743072 A | 6/2010 |
| DE | 29814795 U1 | 12/1998 |

(Continued)

OTHER PUBLICATIONS

Machine translation of DE 102005032890 provided from the website of the European Patent Office.*

(Continued)

*Primary Examiner* — Derek Rosenau
(74) *Attorney, Agent, or Firm* — Morgan, Lewis & Bockius LLP

(57) ABSTRACT

What is specified is a piezoelectric transformer (10) having a surface structure which has at least one protruding surface structure segment (5), wherein the piezoelectric transformer has a contour (3) and is suitable for discharging a gas in conjunction with a counter electrode (10) for generating a plasma, wherein the surface structure is configured such that the gas discharge takes place at a multiplicity of discharge initiation points (6) on the contour (3). A width of the surface structure segment (5) is smaller than the width of the piezoelectric transformer (1).

22 Claims, 2 Drawing Sheets

(56) References Cited

FOREIGN PATENT DOCUMENTS

Figure 1A:
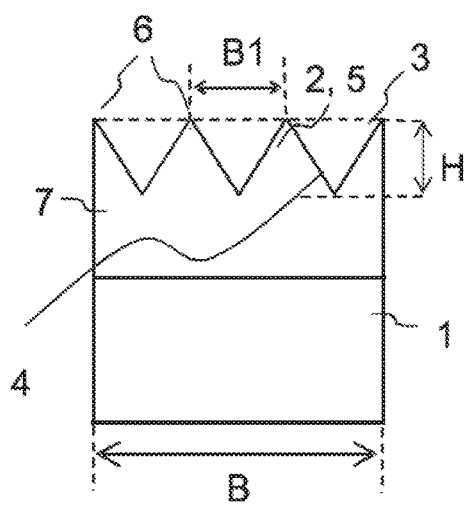

| | | |
|---|---|---|
| DE | 102005032890 B4 | 1/2007 |
| DE | 102008018827 B4 | 5/2010 |
| DE | 102011000261 A1 | 7/2012 |
| JP | H08232819 A | 9/1996 |
| JP | 2000183418 A | 6/2000 |
| JP | 2002100821 A | 4/2002 |
| JP | 2004342331 A | 12/2004 |
| JP | 2007107491 A | 4/2007 |
| JP | 2012089314 A | 5/2012 |
| JP | 2012217761 A | 11/2012 |
| WO | WO-2013164406 A1 | 11/2013 |

OTHER PUBLICATIONS

Fridman, Alexander, "Plasma Chemistry", 2008, pp. 1-1019, Cambridge University Press, New York, NY, attached in 18 parts.

\* cited by examiner

PIEZOELECTRIC TRANSFORMER AND COUNTER ELECTRODE

The present invention relates to a piezoelectric transformer and to a device having a piezoelectric transformer and also to a counter electrode and a device having a counter electrode.

The problem addressed is that of specifying an improved piezoelectric transformer and an improved counter electrode for a device for treating surfaces.

This problem is solved by a piezoelectric transformer having the features of claim 1 and also by a counter electrode having the features of claim 15. Advantageous embodiments and developments are disclosed in the dependent claims.

A proposed piezoelectric transformer has a surface structure which has at least one protruding surface structure segment. The piezoelectric transformer also has a contour and is suitable for discharging a gas in conjunction with a counter electrode for generating a plasma. The surface structure is configured such that the gas discharge takes place at a multiplicity of discharge initiation points on the contour. The gas discharge may be a dielectric barrier discharge or another discharge. The plasma is preferably a cold plasma.

The contour of the surface structure preferably denotes an outline or an envelope or an enveloping line or area of the surface structure. The contour preferably is not the actual external outline of the surface structure, but an imaginary, preferably planar or slightly curved side line or side face. The surface structure is preferably enclosed or defined by the contour, wherein surface points or regions of the surface structure can be arranged directly on the contour or within a region delimited or enclosed by the contour.

The gas discharge preferably occurs at a multiplicity of, preferably discrete, discharge initiation points on the contour of the surface structure. The discharge initiation points preferably denote those points on the contour at which the gas discharge can be initiated firstly or most favorably in terms of energy.

The width of the surface structure segment of the surface structure is also preferably smaller than the width of the piezoelectric transformer.

The width of the surface structure segment preferably extends perpendicularly to a length of the surface structure segments or the surface structure. The width of the piezoelectric transformer accordingly extends preferably perpendicularly to a length of the piezoelectric transformer. These specified lengths and widths may relate to a plan view or a cross section of the specified components.

In a preferred embodiment the surface structure is arranged or formed on an output side of the piezoelectric transformer. The output side preferably denotes a side of the piezoelectric transformer at or via which a transformed output voltage can be tapped.

The surface structure preferably does not describe a single planar end face or output side of the piezoelectric transformer, but for example comprises a texture or a specific, for example microscopically structured surface. The surface structure preferably comprises a multiplicity of protruding surface structure segments (see below). Due to the provision of the surface structure, surface points or regions of the piezoelectric transformer preferably do not lie all together in one plane, but the distance of some surface points for example in relation to a counter electrode of the piezoelectric transformer is greater than the distance of other points. A multiplicity of discharge initiation points which are preferably arranged closest to the counter electrode advantageously can thus be created. Due to the shorter distance, it is made possible at a multiplicity of points on the contour to form a higher local electric field for the discharge of the gas and generation of the plasma.

In a preferred embodiment the surface structure is suitable and/or configured in conjunction with the counter electrode to form a locally increased electric field strength distribution at the discharge initiation points.

The piezoelectric transformer in particular delivers the electrical voltage necessary for the discharge of the gas. The gas may be a stationary gas or a gas flowing through or flowing past the piezoelectric transformer and/or the counter electrode.

In particular, a device for example for treating surfaces can be specified by the specified piezoelectric transformer, which device can be operated more effectively. The efficacy may relate here in particular to the degree of ionization of the gas or the degree of efficacy. Furthermore, for example in the case of air as gas, the proportion of ozone generated per unit of time and air volume can be increased. Due to the provision of the piezoelectric transformer, it is also possible to dispense with the use of high-voltage feed lines from a high-voltage source to the discharge unit and with the use of high-voltage plug contacts and an associated ignition unit. Furthermore, a particularly compact and simple device for treating surfaces can be specified, which is characterized in particular by a space and weight efficiency and/or by few required structural parts or components. Due to a low number of required or interacting components, the reliability of the system as a whole advantageously can be increased in turn, since said system is less susceptible to faults. Furthermore, the presented concept advantageously allows a simplified ignition of a cold plasma. Here, it may also be possible in some circumstances to dispense with the use of a barrier discharge unit as ignition unit for the cold plasma.

In a preferred embodiment the surface structure comprises an electrode or forms an electrode. The gas can thus be discharged in conjunction with the counter electrode for generating the plasma between the electrode and the counter electrode.

In a preferred embodiment the surface structure segment defines the contour of the piezoelectric transformer.

In a preferred embodiment the surface structure comprises a multiplicity of surface structure segments, wherein a gap is arranged in each case between adjacent surface structure segments, and wherein the surface structure segments, together with the gap, form the surface structure. In contrast to the surface profile, the contour preferably encloses the aforementioned gaps. Due to the multiplicity of surface structure segments, a multiplicity of discharge initiation points in particular can be provided for the generation of the plasma, depending on the geometry of the surface structure segments. In terms of energy, a particularly efficient gas discharge is thus made possible, since the gas can be ionized to a particularly high degree.

In a preferred embodiment the surface structure segments are similar. As a result of this embodiment the gas can advantageously be discharged at the surface uniformly or homogenously, and a homogenous plasma can be produced in a manner distributed over the surface. This in particular offers the advantage of a homogenous surface treatment, for example for a cleaning or sterilization of surfaces.

In a preferred embodiment the width of a surface structure segment or the distance between two adjacent surface structure segments is greater than 10 µm. The embodiment is particularly advantageous for plasma generation, since in this way microdischarges can be formed at the surface or at the surface structure. Microdischarges may denote a multiplicity of gas discharges distanced from one another within the micro-meter range.

In a preferred embodiment the surface structure has a surface profile, wherein the profile depth of the surface profile of the surface structure is greater than the width of a surface structure segment. This embodiment advantageously increases an aspect ratio of the surface structure segments, for example as considered in the cross section of the surface structure, whereby—as described above—a geometry of the surface structure can be created particularly expediently, which locally enables the formation of high electric fields between the piezoelectric transformer and for example a counter electrode or a component acting as counter electrode. The surface profile expediently deviates from the contour in that it describes or forms the actual course of the surface structure, for example as considered in a cross section of the surface structure.

In a preferred embodiment the discharge initiation points lie in a plane. Due to the planar geometry, the treatment of a planar surface, which in particular is a two-dimensional treatment, is advantageously also made possible.

In a preferred embodiment the surface structure segments in cross section are triangular, quadrangular, for example rectangular, or have more than four corners. As a result of this embodiment a gas discharge that is particularly efficient in terms of energy can be formed in conjunction with a planar counter electrode. The angular geometries of the surface structure segments also allow the formation of the discharge initiation points in a simple and expedient manner.

In a preferred embodiment the surface structure extends between 2 mm and 4 cm over the width of the piezoelectric transformer.

In an embodiment the surface structure has a polygonal design and comprises a plurality of surface structure segments.

In an embodiment the respective surface structure segment is determined by the straight part of a polygonal line, wherein the discharge initiation points lie in different planes. As a result of this embodiment the plasma can be shaped or formed in such a way that a more rounded surface treatment or a surface treatment shaped in accordance with the polygonal design is made possible, for example as compared with a planar arrangement of the discharge initiation points.

In accordance with this embodiment, the surface structure is preferably formed without gaps.

In an embodiment the surface structure has just a single surface structure segment, which, on the output side of the piezoelectric transformer, defines an end face thereof, wherein the discharge initiation points lie in the same plane. In accordance with this embodiment the width of the surface structure segment is for example less than 100 µm, such that the distance between adjacent discharge initiation points on the end face is also less than, for example, 100 µm. This embodiment advantageously enables a more directed or point-based surface treatment, rather than a two-dimensional surface treatment.

In an embodiment the piezoelectric transformer tapers toward an output side of the piezoelectric transformer.

In an embodiment the surface structure is molded with the piezoelectric transformer by mechanical machining of a raw material of the piezoelectric transformer.

In an embodiment the piezoelectric transformer has a transformer body, on which there is provided a structural part, wherein the surface structure is formed in the structural part, and wherein the structural part is fixedly connected to the transformer body relative to the piezoelectric transformer. As a result of this embodiment, a surface structure can be adapted, via the configuration of the structural part, to conditions necessary for the surface treatment, and the above-mentioned advantages can be utilized without the piezoelectric transformer having to be embodied or machined accordingly. The structural part may be an electrically conductive material, which is expedient in particular in the case of conventional plasma generation, i.e. without dielectric barrier discharge. Alternatively, in the case of a dielectric barrier discharge, the structural part may be an electrically insulating structural part.

In an embodiment the surface structure is electrically conductive. This embodiment enables a conventional plasma generation without dielectric barrier discharge. The omission of the dielectric barrier discharge in particular provides the advantage, in the generation of plasma, of being able to dispense with a corresponding ignition and/or barrier discharge unit.

In an alternative embodiment the surface structure is electrically insulating, wherein the gas discharge is a dielectric barrier discharge. Dielectric barrier discharges, compared with a conventional electrode design, by way of example offer advantages constituted by a high energy efficiency, lower plasma temperatures and minor signs of material wear.

A device comprising the piezoelectric transformer is also specified, which device also comprises a counter electrode which, for example for the generation of the plasma between the piezoelectric transformer and the counter electrode, is arranged facing toward the surface structure. The gas is expediently likewise arranged between the piezoelectric transformer or the output side thereof and the counter electrode. The device offers the advantages already described above.

In a preferred embodiment of the device the counter electrode is planar.

In a preferred embodiment of the device the plasma is a low-energy atmospheric-pressure plasma. As a result of this embodiment, an air environment by way of example can be used advantageously as gas for the discharge.

In a preferred embodiment of the device the gas is helium, carbon, nitrogen or air.

A counter electrode comprising a surface structure which comprises at least one protruding surface structure segment is also provided, wherein the counter electrode has a contour and is suitable for discharging a gas in conjunction with a piezoelectric transformer for generating a plasma, wherein the gas discharge occurs at a multiplicity of, for example discrete, discharge initiation points on the contour of the surface structure.

In particular, all features disclosed for the piezoelectric transformer may also relate to the counter electrode, and vice versa. Furthermore, the advantages for the counter electrode with the surface structure may also be provided analogously to those of the piezoelectric transformer with the surface structure.

In a preferred embodiment of the counter electrode the surface structure has a multiplicity of surface structure segments, wherein gaps are arranged between the surface structure segments, and wherein the gaps, together with the surface structure segments, form the surface structure.

In a preferred embodiment of the counter electrode the surface structure extends along an inner side of the counter electrode. As a result of this embodiment a device for treating surfaces in which a piezoelectric transformer is arranged in a cavity defined by the counter electrode is conceivable.

In an embodiment of the counter electrode the surface structure extends along a length of the counter electrode.

A device comprising a counter electrode and the piezoelectric transformer is also specified, wherein the device is configured to discharge the gas between the surface structure and the piezoelectric transformer.

In a preferred embodiment of the latter device the piezoelectric transformer is arranged at least partially within a cavity formed by the counter electrode. This embodiment advantageously enables a coaxial arrangement of counter electrode and piezoelectric transformer.

In a preferred embodiment of the latter device the piezoelectric transformer is arranged in the device coaxially with the counter electrode.

A further aspect relates to the use of a device for waterproofing surfaces, for increasing the adhesion of plastic films, or for medical treatment of wounds.

Further advantages, advantageous embodiments and expedient features of the invention will become clear from the following description of the exemplary embodiments in conjunction with the figures.

FIG. 1A schematically shows an embodiment of a piezoelectric transformer with a surface structure.

Figure 1B:
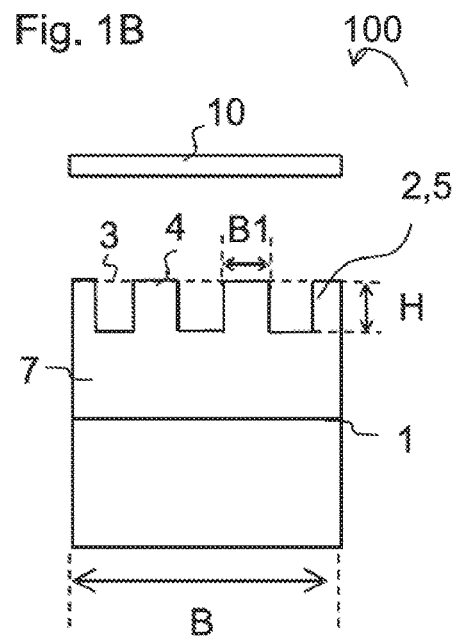

FIG. 1B schematically shows a device comprising a piezoelectric transformer in accordance with an alternative embodiment.

Figure 1C:
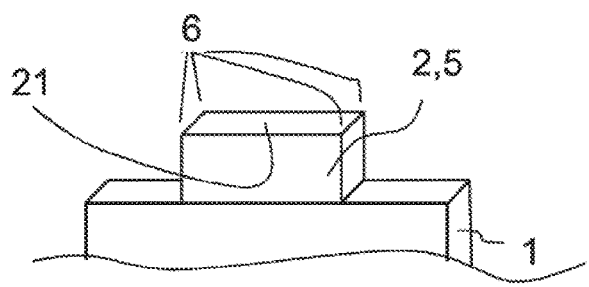

FIG. 1C schematically shows part of an embodiment of the piezoelectric transformer according to FIG. 1B.

Figure 1D:
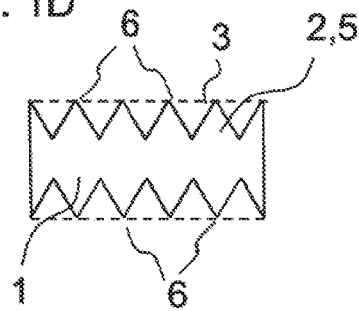

FIG. 1D schematically shows a front view of the piezoelectric transformer in accordance with an alternative embodiment.

Figure 1E:
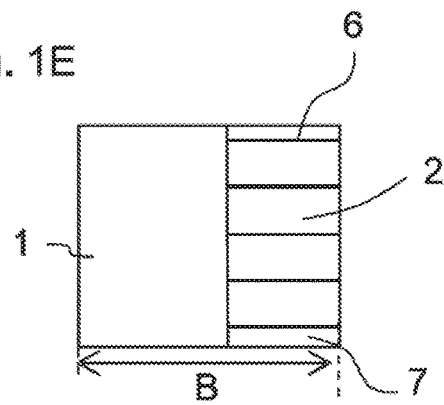

FIG. 1E schematically shows a plan view of the piezoelectric transformer according to FIG. 1D.

Figure 2A:
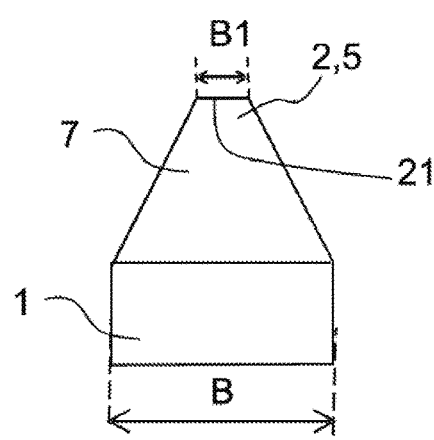
Figure 2B:
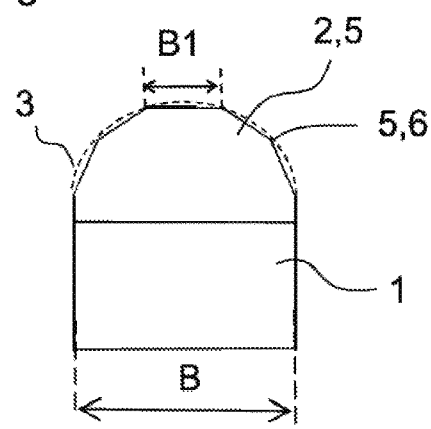

FIGS. 2A and 2B each schematically show a side view of alternative embodiments of surface structures of the piezoelectric transformer.

Figure 3:
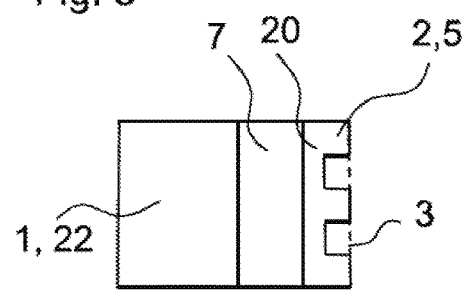

FIG. 3 schematically shows an alternative embodiment of the piezoelectric transformer with a structural part.

Figure 4:
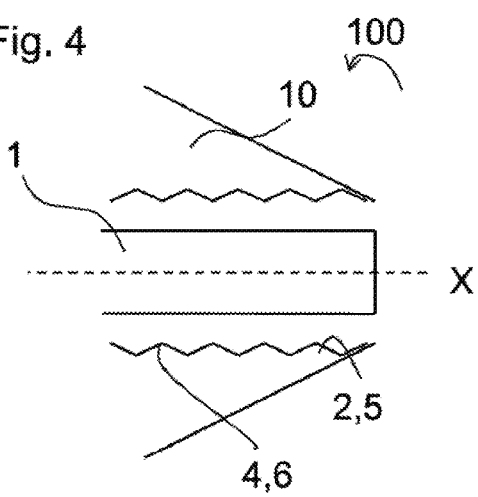

FIG. 4 schematically shows a device for treating surfaces, comprising a piezoelectric transformer and a counter electrode.

Figure 5A:
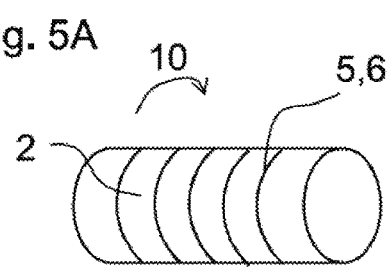
Figure 5B:
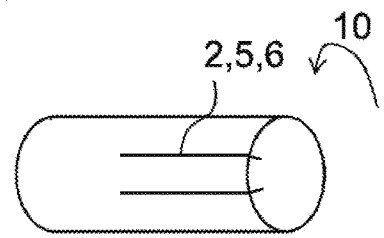

FIGS. 5A and 5B each schematically show different embodiments of the counter electrode according to FIG. 4.

Like, similar and similarly acting elements are provided in the figures with like reference signs. The figures and the proportions of the elements illustrated in the figures relative to one another are not to be considered as to scale. Rather, individual elements may be illustrated in an exaggerated enlargement for improved visualization and/or for improved understanding.

FIG. 1A shows a piezoelectric transformer 1. The piezoelectric transformer 1 may be produced monolithically or in a number of layers. The piezoelectric transformer 1 is preferably also a ceramic piezoelectric transformer. A transformer of this type can be used expediently in order to protect the voltage supply for a gas discharge for generation of a plasma.

The piezoelectric transformer 1 has an output side 7. The output side 7 expediently denotes a side of the piezoelectric transformer 1 at which or via which a suitably transformed output voltage can be tapped. An output side of the piezoelectric transformer 1 is not explicitly indicated. The width of the piezoelectric transformer 1 is indicated by B.

On the output side 7 the piezoelectric transformer 1 also has a surface structure 2. The surface structure 2 extends over the entire width B of the piezoelectric transformer. The surface structure 2 has a surface profile 4 having a multiplicity of surface structure segments 5. The profile depth of the surface profile 4 or the height of the surface structure segments 5 is indicated by H. The profile depth H of the surface profile 4 for the surface structure is preferably greater than the distance between two adjacent surface structure segments 5 or greater than a width B1 of the surface structure segments 5. The width B is preferably between 2 mm and 4 cm.

The width B of the piezoelectric transformer 1 preferably extends perpendicularly to a height (not explicitly indicated in the figures) and a length (see further below) thereof. For a device comprising the piezoelectric transformer 1 and having a counter electrode (see reference sign 10 below), the counter electrode is located relative to the piezoelectric transformer 1, more preferably with a longitudinal side opposite the surface structure 2 and/or at the same height as the surface structure 2. Alternatively or additionally, the counter electrode may expediently face toward the surface structure 2.

The width B1 is preferably many times smaller than the width B of the piezoelectric transformer 1.

The width B1 of the surface structure segments 5 may correspond to the distance between two adjacent surface structure segments 5, as illustrated in FIG. 1A.

The surface structure segments 5 are each triangular in cross section or as considered from the side and are arranged in a plane. The surface structure segments 5 are also formed similarly.

In accordance with the presented embodiment the surface structure segments 5 are formed by the segments triangular in cross section or by parts of the surface of the surface structure 2.

The illustration of FIGS. 1A and 1B may be a longitudinal sectional view or a side view of the piezoelectric transformer 1.

There is a gap (not explicitly indicated) in each case between adjacent surface structure segments, wherein the surface structure segments 5, together with the gaps, form the surface structure 2.

The surface structure segments 5 also define a contour 3 of the surface structure 2. The width of a surface structure segment 5 and/or the distance between two adjacent surface structure segments 5 is preferably greater than 10 μm.

At the lateral edges of the surface structure 2, the surface structure segments 5 are in each case formed only over half of the width B1 or in each case are cut off by the side edges of the piezoelectric transformer 1. This may be expedient or may signify a simplification in the manufacture of the piezoelectric transformer 1, in particular by the cutting of a main body for the piezoelectric transformer.

The piezoelectric transformer 1 is preferably suitable for discharging a gas in conjunction with a counter electrode (see reference sign 10 in FIG. 1B) for generating a plasma, wherein the discharge occurs at a multiplicity of, for example discrete, discharge initiation points 6 on the contour 3 of the surface structure 2. The discharge initiation points 6 preferably constitute, on the output side, outermost points or regions of the piezoelectric transformer or of the surface structure 2. These are located in FIG. 1A at the points at which the surface structure 2 or the surface structure segments 5 is/are tangent to the contour 3. A gas discharge preferably can be initiated at the discharge initiation point 6 most easily and/or most favorably in terms of energy.

A gas discharge may occur or take place during operation of the piezoelectric transformer advantageously at the discharge initiation points 6 on the contour 3 of the surface structure 2, since the geometric distance of the discharge initiation points 6 relative to a component (see 10 in FIG. 1B) acting as counter electrode of the piezoelectric transformer 1 is shorter than at surface points 5 of the surface structure 2 which do not lie on the contour 3. The component acting as counter electrode may be, for example, a preferably planar counter electrode arranged opposite the surface structure 2. Alternatively, this may be a plasma per se. Alternatively, this may be a surface to be treated by the plasma.

Due to the shorter geometric distance of the aforementioned component, a locally increased electrical field strength distribution can preferably be formed in the discharge initiation points 6, and the degree of ionization of the gas or the plasma can be increased.

FIG. 1B shows a device 100 for treating surfaces. The device 100 comprises a piezoelectric transformer 1 in accordance with an alternative embodiment. In the case of the piezoelectric transformer 1, in contrast to that from FIG. 1A, the surface structure segments 5 of the surface structure 2 are rectangular or square in cross section. Correspondingly to the surface structure segments 5, the gaps between these are rectangular or square in order to form the surface structure segments 5.

Although not explicitly illustrated, the surface structure segments may also comprise further expedient shapes and may be polygonal in cross section and/or may have more than four corners, by way of example.

By contrast to that illustrated in FIGS. 1A and 1B, the surface structure may also be formed such that this or the surface structure segments extends/extend, instead of across the width B of the piezoelectric transformer, along the depth or height thereof (into the drawing plane in FIGS. 1A and 1B).

The device 100 also has a counter electrode 10. The counter electrode 10 faces toward the surface structure 2 of the piezoelectric transformer 1 and is arranged at a distance therefrom. The device 100 is preferably a device for treating surfaces by means of a plasma. During operation of the device, a gas is preferably arranged in the gap between the piezoelectric transformer 1 and the counter electrode 10, which gas can be discharged for generation of the plasma by means of the device 100 and possibly further components for generating the plasma. The counter electrode 10 is planar. Alternatively, the counter electrode 10 instead of the piezoelectric transformer could comprise the described surface structure. Accordingly, any feature described for the surface structure can relate to the piezoelectric transformer and/or the counter electrode.

FIG. 1C schematically shows a perspective, enlarged view of an individual surface structure segment 5 in accordance with the embodiment shown in FIG. 1A. The discharge initiation points 6 are preferably located at the side edges or corners of any surface structure segment 5. An end face of the output side of the piezoelectric transformer is indicated by reference sign 21.

FIG. 1D shows a front view, end face, or a cross section of the piezoelectric transformer 1 in an alternative embodiment, in which opposite surfaces on the output side are provided with the surface structure 2.

In FIG. 1E a plan view of a piezoelectric transformer 1 in accordance with the embodiment of FIG. 1D is shown. The discharge initiation points 6 are indicated in FIG. 1E on the output side 7 with horizontal lines, along which discharge initiation points 6 can be arranged or can be formed. A gas discharge may therefore preferably take place along the aforementioned lines.

In accordance with this embodiment the surface structure segments 5 (in contrast to FIGS. 1A and 1B) extend along a main surface and in part along a length L of the piezoelectric transformer 1 (see also FIG. 1E). As illustrated, the surface structure segments 5 preferably extend over the entire output side 7 of the piezoelectric transformer 1. The length L may extend in FIGS. 1A and 1B vertically, i.e. perpendicularly to the width B.

The embodiments shown in FIGS. 1D and 1E are in particular suitable for piezoelectric transformers which for example are designed for devices for a particularly focused surface treatment.

FIG. 2A shows an alternative embodiment of a piezoelectric transformer 1, in which the surface structure 2 has just a single surface structure segment 5. The surface structure segment 5 is formed by an output-side tapering of the piezoelectric transformer 1. In particular, the piezoelectric transformer tapers lengthwise on the output side as far as the output-side end face 21, wherein the surface structure 2 is defined at least in part by the end face 21. In accordance with this embodiment the surface structure segment 5 is determined by the end face 21. The width B1 is here preferably much smaller than the width B and than a longitudinal extension of the output side 7. The width B1 of the surface structure segment may lie for example in the micrometer or millimeter range.

FIG. 2B shows a further alternative embodiment of a piezoelectric transformer 1. The surface structure 2 has in this case a plurality of surface structure segments 5, which for example, in contrast to those from FIGS. 1A, 1B and 1E, are not arranged in one plane, but in different planes. The surface structure 2 instead has a number of corners or is polygonal in cross section, such that the discharge initiation points are preferably arranged at the corners or edges of the surface structure 2. In particular, the surface structure 2 has a polygonal design, wherein the respective surface structure segment 5 is determined by a straight part of the polygonal line. In accordance with the surface structure segment 5, the discharge initiation points 6 are arranged in different planes. The contour 3, which (as described above) is defined by the surface structure segments 5, extends semi-circularly.

FIG. 3 shows an alternative embodiment of a piezoelectric transformer 1, which, per se or formed from the same main body, does not have a surface structure. Instead, when manufacturing or producing the piezoelectric transformer 1, a transformer body 22 is provided with a structural part 20. The structural part 20 preferably has the surface structure 2. This has, in FIG. 3, rectangular surface structure segments 5 corresponding to FIG. 1B. Alternatively, the surface structure 2 may be formed correspondingly to any surface structure 2 described here. The structural part 20 is for example fixedly mounted or formed on the transformer body 22 on the output side using suitable means.

The structural part 20, relative to the piezoelectric transformer 1, is expediently mechanically rigidly connected thereto, such that the structural part 20 during operation of the piezoelectric transformer can absorb the mechanical vibration of the piezoelectric transformer 1, for example. Here, the structural part 20 can be mounted indirectly or directly on the piezoelectric transformer 1.

The surface structure 2 may be electrically conductive within the scope of the application and in the case of a conventional electrode design. In the case of the generation of a plasma by a dielectric barrier discharge, the surface structure 2 may alternatively also be electrically insulating.

In the case of a barrier discharge unit, a stationary gas or a gas flowing past may be ionized in order to generate a cold plasma, for example. The electrical voltages necessary for the discharge may comprise alternating voltages of a few thousand volts.

In particular, a dielectric barrier discharge means that the high voltage builds up between electrodes, but at least one of said electrodes is shielded by a dielectric.

FIG. 4 schematically shows an alternative embodiment of the device 100. The illustration is preferably a side or cross-sectional view of the device 100. The device 100 comprises a piezoelectric transformer 1. The device 100 also comprises a counter electrode 10. In contrast to the device shown in FIG. 1B the counter electrode 10 (instead of the piezoelectric transformer 1) comprises the surface structure 2. The surface structure 2, correspondingly to that from FIG. 1A, is formed with surface structure segments 5 that are triangular in the sectional view; the surface structure, however, may also be formed analogously to all surface structures described here.

The piezoelectric transformer 1 is arranged in a cavity or gap (not explicitly indicated) defined by the counter electrode 10. The piezoelectric transformer 1 is also arranged coaxially with the piezoelectric transformer 1 about a longitudinal axis X of the device 100. In FIG. 4 the surface structure preferably extends decisively over the length of the counter electrode 10 and/or of the piezoelectric transformer 1.

A gas (not explicitly illustrated) for discharging a plasma can be arranged in a stationary manner in the gap or cavity between the counter electrode 10 and the piezoelectric transformer 1 or may flow therethrough. The gas may be helium, argon, nitrogen, air (for example ambient air), or another gas. The plasma is preferably a low-energy atmospheric-pressure plasma.

In FIG. 5a a counter electrode 10 is schematically shown, which, insofar as FIG. 4 relates to a cross section of the device 100, is formed analogously to the surface structure 2 shown in FIG. 4. The surface structure 2 is formed in such a way that the discharge initiation points 6 extend circumferentially around the counter electrode 10. The possible discharge initiation points 6 are indicated by the lines.

FIG. 5b schematically shows an alternative embodiment of a counter electrode 10, in which the surface structure 2 is formed in such a way that the discharge initiation points 6 extend along a longitudinal axis X of the counter electrode 10.

Due to the formation of the surface structure along with surface structure segments and discharge initiation points, the number of gas discharges at the surface of the piezoelectric transformer or of the counter electrode can be maximized in particular, and therefore the degree of ionization of the plasma for treating surfaces can be increased. This can lead in turn to a surface treatment that is more energy efficient and also more homogenous in space.

The treatment of surfaces preferably concerns the waterproofing of surfaces, the increase of the adhesion of plastic films, and/or the medical treatment of wounds.

In the case of a surface treatment with ozone, ambient air is preferably used as gas for the gas discharge for generation of the plasma. A fine adjustment of the generated plasma geometry can be achieved in this case by pulse-width-modulated control of the piezoelectric transformer.

Furthermore, in the case of a surface treatment with ozone, a degree of efficacy for the plasma generation or ozone generation can be increased further still by means of the device with a multiple arrangement of piezoelectric transformers together with structural parts.

The invention is not limited by the description provided on the basis of the exemplary embodiments. Rather, the invention includes any new feature and any combination of features which in particular includes any combination of features in the claims, even if this feature or this combination itself is not explicitly specified in the claims or exemplary embodiments.

LIST OF REFERENCE SIGNS 1 piezoelectric transformer
2 surface structure
3 contour
4 surface profile
5 surface structure segment
6 discharge initiation point
7 output side
10 counter electrode
20 structural part
21 end face
22 transformer body
100 device
X longitudinal axis
L length
B, B1 width
H profile depth

The invention claimed is:

1. A piezoelectric transformer having a surface structure which has at least one protruding surface structure segment, wherein the piezoelectric transformer has a contour and is suitable for discharging a gas which is arranged in a gap between the piezoelectric transformer and a counter electrode in conjunction with the counter electrode for generating a plasma, wherein the surface structure is configured such that the gas discharge takes place at a multiplicity of discharge initiation points on the contour, and wherein the width of the surface structure segment of the surface structure is smaller than the width of the piezoelectric transformer.

2. The piezoelectric transformer according to claim 1, wherein the surface structure segment defines the contour of the piezoelectric transformer.

3. The piezoelectric transformer according to claim 1, wherein the width of the surface structure segment is greater than 10 μm.

4. The piezoelectric transformer according to claim 1, wherein the surface structure extends between 2 mm and 4 cm over the width of the piezoelectric transformer.

5. The piezoelectric transformer according to claim 1, wherein the surface structure has a plurality of surface structure segments, wherein a gap is arranged in each case between adjacent surface structure segments, and wherein the surface structure segments, together with the gap, form the surface structure.

6. The piezoelectric transformer according to claim 5, wherein the surface structure has a surface profile, and wherein the profile depth (H) of the surface profile of the surface structure is greater than the width of a surface structure segment.

7. The piezoelectric transformer according to claim 5, wherein the discharge initiation points lie in a plane, and wherein the surface structure segments in cross section are triangular, quadrangular, for example rectangular, or have more than four corners.

8. The piezoelectric transformer according to claim 1, wherein the surface structure has a polygonal design and comprises a plurality of surface structure segments, and wherein the respective surface structure segment is determined by the straight part of a polygonal line, and wherein the discharge initiation points lie in different planes.

9. The piezoelectric transformer according to claim 1, wherein the surface structure has just a single surface structure segment, which on the output side of the piezoelectric transformer defines an end face thereof, and wherein the discharge initiation points lie in the same plane.

10. The piezoelectric transformer according to claim 1, which tapers toward an output side of the piezoelectric transformer.

11. The piezoelectric transformer according to claim 1, wherein the piezoelectric transformer has a transformer body which is provided with a structural part, wherein the surface structure is formed in the structural part, and wherein the structural part is fixedly connected to the transformer body.

12. The piezoelectric transformer according to claim 1, wherein the surface structure is electrically conductive.

13. The piezoelectric transformer according to claim 1, wherein the surface structure is electrically insulating, and wherein the gas discharge is a dielectric barrier discharge.

14. A device having a piezoelectric transformer according to claim 1, wherein the device comprises a counter electrode which is arranged facing toward the surface structure, and wherein the counter electrode is planar.

15. The piezoelectric transformer according to claim 1, wherein the contour, which is defined by the surface structure segments, extends semi-circularly.

16. A counter electrode comprising a surface structure which comprises at least one protruding surface structure segment, wherein the counter electrode has a contour and is suitable for discharging a gas which is arranged in a gap between a piezoelectric transformer and the counter electrode in conjunction with the piezoelectric transformer for generating a plasma, wherein the gas discharge occurs at a multiplicity of discharge initiation points on the contour.

17. The counter electrode according to claim 16, wherein the surface structure comprises a multiplicity of surface structure segments, wherein gaps are arranged between the surface structure segments, and wherein the gaps, together with the surface structure segments, form the surface structure.

18. A device having a counter electrode according to claim 16 and a piezoelectric transformer, wherein the device is configured to discharge the gas between the surface structure and the piezoelectric transformer.

19. The device according to claim 18, wherein the piezoelectric transformer is arranged at least in part within a cavity formed by the counter electrode.

20. The device according to claim 18, wherein the width of the surface structure segment of the surface structure is smaller than the width of the piezoelectric transformer.

21. A piezoelectric transformer having a surface structure which has at least one protruding surface structure segment, wherein the piezoelectric transformer has a contour and is suitable for discharging a gas in conjunction with a counter electrode for generating a plasma, wherein the surface structure is configured such that the gas discharge takes place at a multiplicity of discharge initiation points on the contour, and wherein the width of the surface structure segment of the surface structure is smaller than the width of the piezoelectric transformer, wherein the width of the surface structure segment is greater than 10 μm.

22. A piezoelectric transformer having a surface structure which has at least one protruding surface structure segment, wherein the piezoelectric transformer has a contour and is suitable for discharging a gas in conjunction with a counter electrode for generating a plasma, wherein the surface structure is configured such that the gas discharge takes place at a multiplicity of discharge initiation points on the contour, and wherein the width of the surface structure segment of the surface structure is smaller than the width of the piezoelectric transformer, wherein the surface structure extends between 2 mm and 4 cm over the width of the piezoelectric transformer.

* * * * *